(12) United States Patent
Abe

(10) Patent No.: US 7,812,452 B2
(45) Date of Patent: Oct. 12, 2010

(54) SEMICONDUCTOR DEVICE HAVING BARRIER LAYER COMPRISED OF DISSIMILAR MATERIALS, AND METHOD FOR FABRICATING THE SAME

(75) Inventor: Kazuhide Abe, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 386 days.

(21) Appl. No.: 11/826,331

(22) Filed: Jul. 13, 2007

(65) Prior Publication Data

US 2008/0061399 A1    Mar. 13, 2008

(30) Foreign Application Priority Data

Sep. 11, 2006    (JP) .............................. 2006-244996

(51) Int. Cl.
*H01L 23/52* (2006.01)
(52) U.S. Cl. ................... 257/751; 257/295; 257/310; 257/767; 257/E23.145; 257/E23.16
(58) Field of Classification Search .............. 257/295, 257/296, 306, 310, 532, 535, 751, 767, E23.144, 257/E23.145, E23.158, E23.159, E23.16
See application file for complete search history.

(56) References Cited

U.S. PATENT DOCUMENTS

| 6,225,656 | B1 * | 5/2001 | Cuchiaro et al. | ............. 257/295 |
| 2006/0220083 | A1 * | 10/2006 | Abe | ......................... 257/295 |
| 2007/0045687 | A1 * | 3/2007 | Kumura et al. | .............. 257/295 |
| 2008/0224194 | A1 * | 9/2008 | Sashida | ...................... 257/295 |

FOREIGN PATENT DOCUMENTS

| JP | 6-151815 | 5/1994 |
| JP | 8-181212 | 7/1996 |

* cited by examiner

*Primary Examiner*—Matthew E Warren
(74) *Attorney, Agent, or Firm*—Rabin & Berdo, PC

(57) ABSTRACT

A semiconductor device according to the present invention includes a semiconductor substrate; a capacitor having a lower electrode formed on said semiconductor substrate, a capacity insulating film formed on said lower electrode, and an upper electrode formed on said capacity insulating film; contact holes formed on said upper electrode and said lower electrode; a barrier layer containing oxygen, formed inside said contact holes; and a conductive layer which fills said contact holes in which said barrier layer is formed on the inside.

4 Claims, 17 Drawing Sheets

SEMICONDUCTOR DEVICE HAVING BARRIER LAYER COMPRISED OF DISSIMILAR MATERIALS, AND METHOD FOR FABRICATING THE SAME

CROSS REFERENCE TO RELATED APPLICATION

This application claims the priority of Application No. 2006-244996, filed Sep. 11, 2006 in Japan, the subject matter of which is incorporated herein by reference.

TECHNICAL FIELD OF THE INVENTION

The present invention relates to a wiring configuration for a semiconductor device, and a method of fabricating the same.

BACKGROUND OF THE INVENTION

Ferroelectric Random Access Memory (FeRAM) is a type of high speed and non-volatile memory which utilizes the hyteresis properties of ferroelectric materials. While offering the same high-speed read and write capabilities as Dynamic Random Access memory (DRAM), FeRAM has clear advantages including non-volatility and low power consumption. For this reason, FeRAM has the potential to replace existing memory types such as EEPROM and SRAM, and development is proceeding in this area.

FIG. 1 shows the cross-sectional structure of a conventional ferroelectric memory cell. This structure is formed by the addition between the CMOS process and the wiring process of a ferroelectric process by way of a number of masks. Ideally, a memory-embedded LSI is realized by simply adding the memory section, without altering the processes used for the CMOS or wiring sections in any way.

However, from a practical standpoint, the introduction of a ferroelectric member requires the use of new practices and materials. For example, ferroelectric materials are extremely vulnerable to a deterioration of characteristics in a reducing atmosphere, and for this reason, the introduction of a hydrogen ($H_2$) diffusion barrier film 118 made of TaOx or the like, or a passivation film 114 made of SiN or the like which prevents hydrogen diffusion, is required. The SiN film is formed by a sputtering method. If such a film is formed by plasma CVD (chemical vapor deposition), a reducing atmosphere would must be present, and the resulting film will contain a large amount of hydrogen. Furthermore, in some cases a $Al_2O_3$ film may be used instead of a SiN film.

To manufacture a ferroelectric capacitor, heat treatment at a high temperature in an oxidizing atmosphere is required to restore the characteristics of the ferroelectric material after sintering or etching. Consequently, the lower electrode or upper electrode must be made of a metal which has high oxidation resistance, a metal which remains conductive after oxidation, or a conductive oxide. One material which satisfies this requirement is platinum (Pt), which, despite being seldom used in existing LSI products, is a stable element that does not oxidize easily.

The conventional ferroelectric memory cell shown in FIG. 1 is manufactured by using a CVD method to deposit an insulating layer on a semiconductor substrate 101 on which transistors (102a, 102b, 102c) have already been formed by a known method. A BPSG film is then flowed to planarize the surface. Then, an insulating layer made of spin-on glass (SOG) is applied by spin coating and etched back to form a first insulating layer 103.

Next, photolithography and etching are performed to form a plurality of holes in the areas where the contact holes are to be located. Then, implantation of a contact material is performed, followed by heat treatment. After heat treatment, a metal film (Ti film) is deposited using a CVD method. After the Ti film is deposited, nitriding treatment is carried out in the same chamber. Next, a W film is deposited using a CVD method. Reference numeral 104 indicates a metal plug.

Next, a second insulating layer 105 is deposited by a sputtering method to serve as an adhesion layer for a lower electrode of a capacity insulating film. Then, the lower electrode 106 of the capacity insulating film, the capacity insulating film 107, and the upper electrode 108 of the capacity insulating film are deposited sequentially. The lower electrode 106 and the upper electrode 108 are formed from Pt using a sputtering method.

Next, the upper electrode 108 made of Pt is processed by photolithography and etching. Then, the capacity insulating film 107 made of SBT and the lower electrode 106 made of Pt are processed by photolithography and etching. After etching, heat treatment is performed with an object of restoring the ferroelectric properties. Then, a third insulating film 110 is deposited using a CVD method.

Next, contact holes are formed in the upper electrode 108 and the lower electrode 106 of the capacitor 109. After the contact holes are formed, heat treatment is performed with an object of restoring the ferroelectric properties. Subsequently, contact holes 112 are formed above the metal plugs 104. Then a barrier film 120 made of titanium nitride (TiN) is deposited.

Next, a main conductive film 113 made of an Al alloy is formed, and a conductive film 114 made of TiN which serves as an anti-reflection coating is formed thereon. Finally, the barrier film 120, the main conductive film 113, and the conductive film 114 are processed by photolithography and etching, thereby forming the wiring pattern. Reference numerals 117, 118, and 119 indicate secondary wiring, a hydrogen diffusion barrier film, and a passivation film, respectively.

The following are examples of documents disclosing the related art.

[Patent Document 1] Japanese Unexamined Patent Publication No. H08-181212

[Patent Document 2] Japanese Unexamined Patent Publication No. H06-151815

Pt, which is the electrode material, is highly reactive to the aluminum (Al) alloy typically used as the wiring material. After the Al alloy wiring is formed, heat treatment is performed under an $O_2$ atmosphere at 400° C. for 30 minutes, for example, to restore the ferroelectric capacitor characteristics. At this time, the Al diffuses through the TiN crystal grains serving as the barrier metal, and a reaction occurs between the Al and Pt. This results in the formation of an $Al_2Pt$ compound which causes volume expansion of the contacting section, in some cases to the extent that the capacitor is ruined. This situation is shown in FIG. 2.

TiN has a columnar crystal structure, wherein the Al atoms diffuse through the space between TiN grains. Thus, one conceivable method for improving the barrier properties of the TiN film is to increase the thickness of the TiN film, thereby lengthening the diffusion path of the Al. However, increasing the thickness of the TiN film, which is formed using a sputtering method, promotes the formation of a TiN overhang at the top of the contact. This reduces the embeddability of the Al alloy film at the contacts with the ferroelectric electrode and at the other contacts, causing deterioration in the electrical characteristics. Furthermore, there is a concern that if insufficient quantities of the Al alloy are embedded in the contacts, variation in the shape of the contacts and other factors can cause variability in electrical characteristics between lots or within a given wafer.

OBJECTS OF THE INVENTION

Accordingly, an object of the present invention is to provide a semiconductor device in which the encroachment of the conductive material into the capacitor electrode material can be controlled, and a method of manufacturing such a semiconductor device.

Additional objects, advantages and novel features of the present invention will be set forth in part in the description that follows, and in part will become apparent to those skilled in the art upon examination of the following or may be learned by practice of the invention. The objects and advantages of the invention may be realized and attained by means of the instrumentalities and combinations particularly pointed out in the appended claims.

SUMMARY OF THE INVENTION

According to a first aspect of the invention, a semiconductor device includes: a semiconductor substrate; a capacitor comprising a lower electrode formed on the semiconductor substrate, a capacity insulating film formed on the lower electrode, and an upper electrode formed on the capacity insulating film; contact holes formed on the upper electrode and the lower electrode; a barrier layer containing oxygen, formed inside the contact holes; and a conductive layer which fills the contact holes in which the barrier layer is formed on the inside.

According to a second aspect of the invention, a method for fabricating a semiconductor device includes the steps of: forming a lower electrode made of Pt on the semiconductor substrate to serve as part of a capacitor; forming a capacity insulating film on the lower electrode to serve as part of the capacitor; a step for forming an upper electrode made of Pt on the capacity insulating film to serve as part of the capacitor; forming a first insulating film so as to cover the capacitor; forming contact holes in the upper electrode and the first insulating film on the lower electrode; a step for forming a first barrier layer in the contact holes; for forming a second barrier layer on the first barrier layer; and for filling the contact holes whose insides are covered by the first and second barrier layers with a conductive layer made of Al or an Al alloy. Furthermore, the first barrier layer is formed by sputtering at a deposition pressure of 10 to 15 mTorr.

Here, the fabricating method preferably includes a step for exposing the substrate in the air after formation of the first barrier layer.

More preferably, the deposition pressure of the first barrier layer is 12 mTorr or greater.

According to the present invention, by using a laminated barrier consisting of a first barrier layer having high oxygen uptake and reduced compressive stress serving as the lower layer, and a second barrier layer having greater compressive stress than the lower layer serving as the upper layer, encroachment of the conductive layer into the capacitor electrode during heat treatment can be suppressed. In particular, increasing the oxygen uptake of the first barrier layer has a significant effect in terms of suppressing diffusion of the conductive layer made of Al or the like.

BRIEF DESCRIPTION OF THE REFERENCE SYMBOLS

Figure 1:
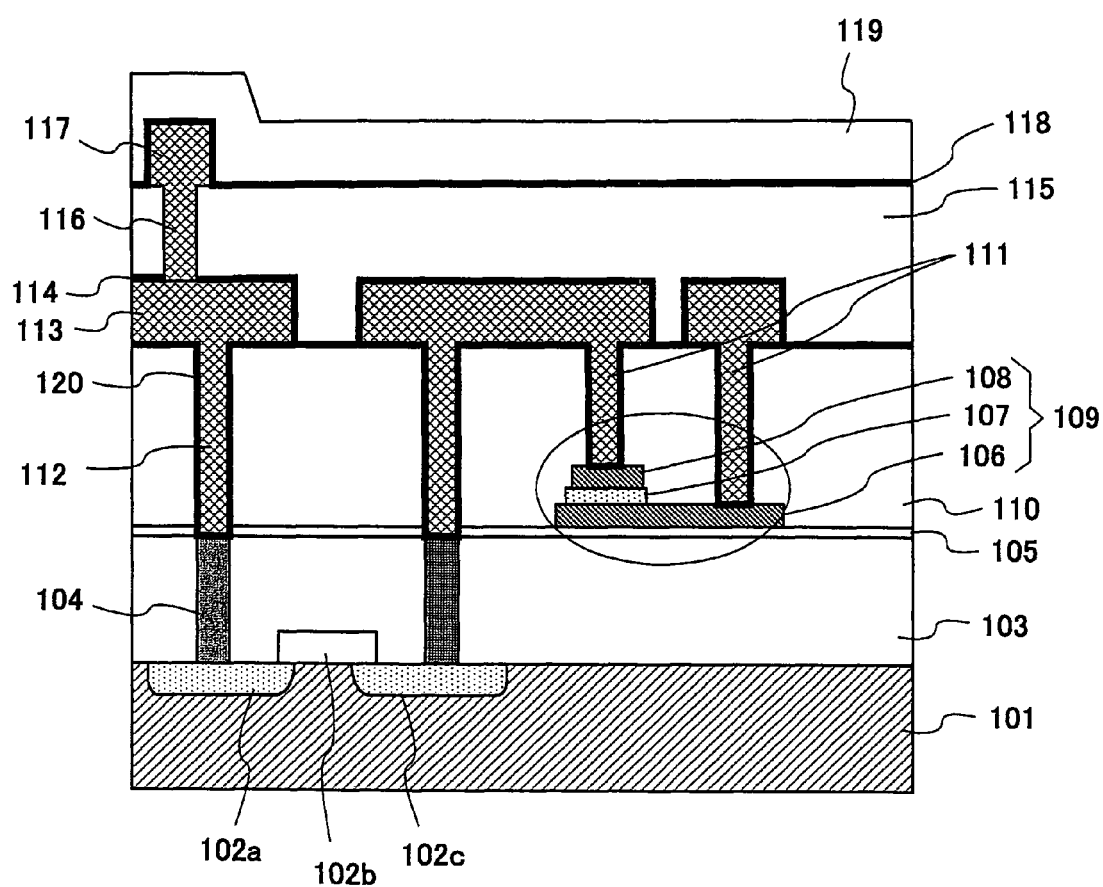
FIG. 1 is a cross-sectional view showing the structure of a conventional semiconductor device.
Figure 2:
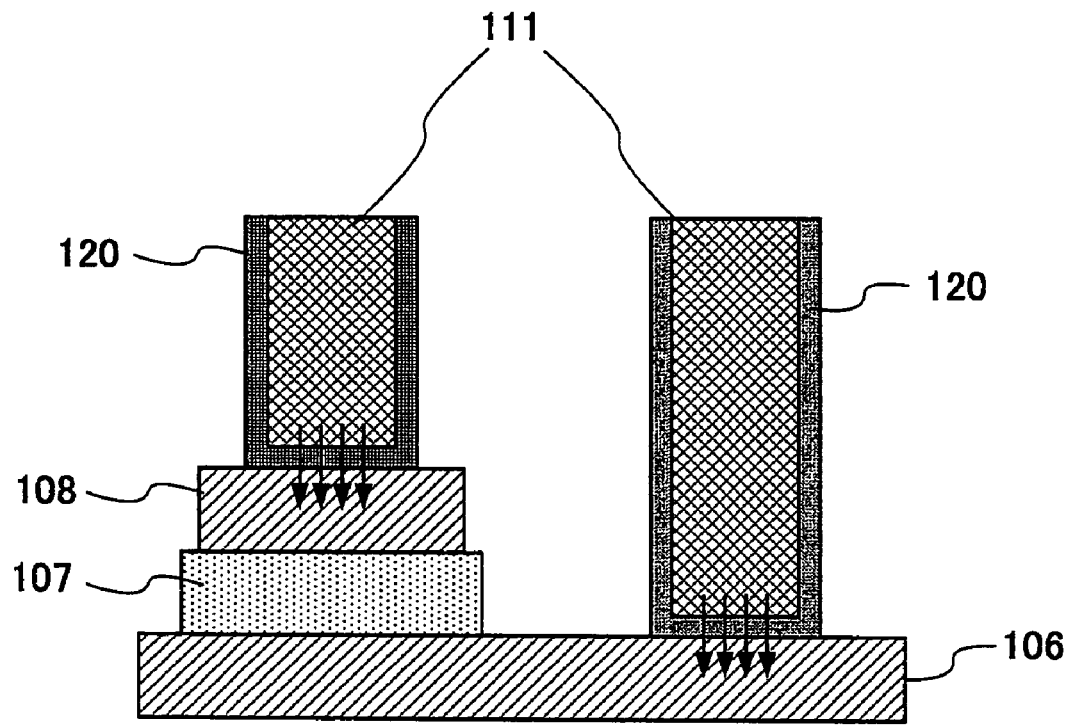
FIG. 2 is an enlarged view showing the circled portion of FIG. 1.

201, 301 Semiconductor substrate
206, 306 Lower electrode of capacitor
207, 307 Capacity insulating film of capacitor
208, 308 Upper electrode of capacitor
211, 212, 311, 312 Contact hole
213, 313, 214, 314, 315 Barrier layer
215, 316 Conductive layer

DETAILED DISCLOSURE OF THE INVENTION

In the following detailed description of the preferred embodiments, reference is made to the accompanying drawings which form a part hereof, and in which is shown by way of illustration specific preferred embodiments in which the invention may be practiced. These preferred embodiments are described in sufficient detail to enable those skilled in the art to practice the invention, and it is to be understood that other preferred embodiments may be utilized and that logical, mechanical and electrical changes may be made without departing from the spirit and scope of the present invention. The following detailed description is, therefore, not to be taken in a limiting sense, and scope of the present inventions is defined only by the appended claims.

Figure 3A:
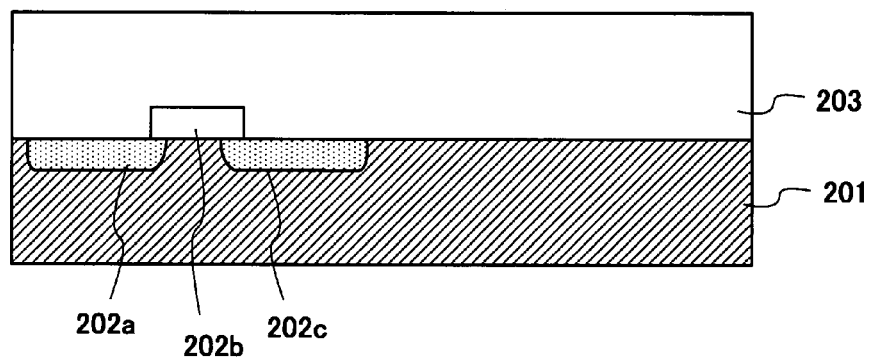
FIG. 3A to FIG. 3J are cross-sectional views showing the manufacturing steps for a semiconductor device according to a first embodiment of the present invention.

FIG. 3A through FIG. 3J are cross-sectional views showing the steps used to manufacture a semiconductor device according to a first embodiment of the present invention. First, an insulating layer made of $O_3$-TEOS BPSG is deposited using a CVD method to a film thickness of 1200 nm on a semiconductor substrate 201 on which transistors (202a, 202b, 202c) have been formed by a known method. Then, to planarize the surface, heat treatment is performed at 850° C. for 20 minutes under a $N_2$ atmosphere, and a BPSG film is flowed. In addition, an insulating layer made of spin-on glass (SOG) is applied to a thickness of 470 nm by spin coating and then etched back, thereby forming a first insulating layer 203 with a film thickness of 850 nm (FIG. 3A). The gases used in the etching process are, for example, $C_4F_8$, Ar, $O_2$, and carbon monoxide (CO). As the etching conditions, a gas flow rate of $C_4F_8/Ar/O_2/CO=14/100/150/5$ sccm, RF power of 1500 W, and a chamber pressure of 50 mTorr are used.

Next, photolithography and etching are performed to form a plurality of holes in the areas where the contact holes are to be located. The gases used in the etching of the holes are, for example, trifluoromethane ($CHF_3$), carbon tetrafluoride ($CF_4$), and Ar or the like. As the etching conditions, a gas flow rate of $CHF_3/CF_4/Ar=40/15/400$ sccm, RF power of 800 W, and a chamber pressure of 500 mTorr are used. Next, contact implantation of P+ or BF2+ or the like is performed, followed by heat treatment at 1000° C. for 10 seconds.

After heat treatment, metal films of Ti and TiN are deposited by a CVD method to film thicknesses of 15 nm and 20 nm, respectively. To deposit the Ti film, titanium tetrachloride ($TiCl_4$), argon (Ar), and $H_2$, for example, are used. The deposition conditions are, for example, a gas flow rate of $TiCl_4/Ar/H_2=5/350/1500$ sccm, a chamber pressure of 5 Torr, RF power of 350 W, and a stage temperature of 630° C. After Ti deposition, nitriding treatment is carried out in the same chamber. The conditions for this treatment are, for example, a gas flow rate of $NH_3/N_2/Ar=500/250/350$ sccm, a chamber pressure of 5 Torr, RF power of 500 W, and a stage temperature of 630° C. On the other hand, to deposit the TiN film, for example, $TiCl_4$, ammonia ($NH_3$), and Ar are used. The deposition conditions are, for example, a gas flow rate of $TiCl_4/NH_3/N_2=35/400/350$ sccm, a chamber pressure of 300 mTorr, and a stage temperature of 680° C.

After TiN deposition, heat treatment is carried out in the same chamber with an object of removing chlorine from the TiN film and reducing its resistance. The heat treatment conditions are, for example, a gas flow rate of $NH_3/N_2=4000/400$ sccm, a chamber pressure of 8 Torr, and a stage temperature of 680° C.

Figure 3B:
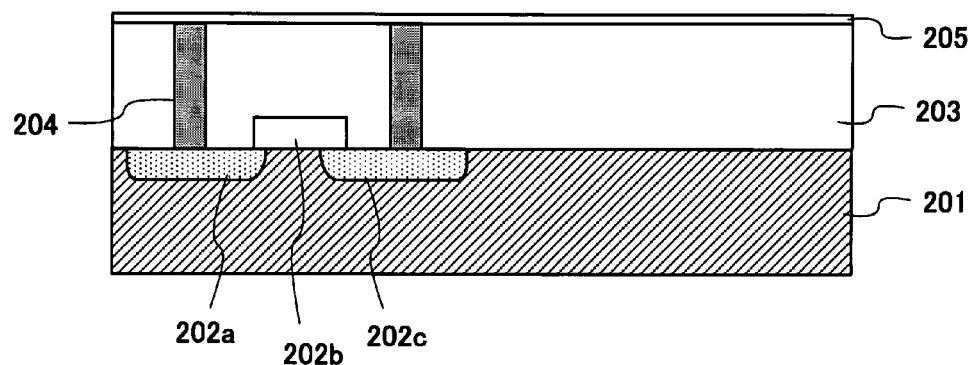

Next, a W film is deposited to a film thickness of 600 nm using a CVD method. In the formation of the W film, tungsten hexafluoride ($WF_6$), monosilane ($SiH_4$), and $H_2$, for example, are used. The deposition process is divided into two steps, each with different deposition conditions. For example, in the first step which achieves tungsten nucleation, the conditions are a gas flow rate of $WF_6/SiH_4=300/100$ sccm, a chamber pressure of 300 mTorr, and a stage temperature of 400° C. In the second step, the conditions are a gas flow rate of $WF_6/H_2=500/6500$ sccm, a chamber pressure of 30 Torr, and a stage temperature of 400° C. The Ti, TiN and W films are then etched back to form metal plugs 204 (FIG. 3B). The gases used in the etching process are, for example, sulfur hexafluoride ($SF_6$) and $O_2$. As the etching conditions, a gas flow rate of $SF6/O_2=250/50$ sccm, RF power of 300 W, and a chamber pressure of 150 mTorr are used.

Next, a second insulating layer 205 is deposited using a sputtering method, to serve as an adhesion layer for a lower electrode of a capacity insulating film (FIG. 3B). For example, the adhesion layer 205 can be made of tantalum oxide (TaxOy). Deposition is performed using Ta as the target and an $Ar/O_2$ mixed gas as the process gas, under a sputtering atmospheric pressure of 9.5 mTorr, RF power of 1.6 kW, and a deposition temperature of 200° C.

Figure 3C:
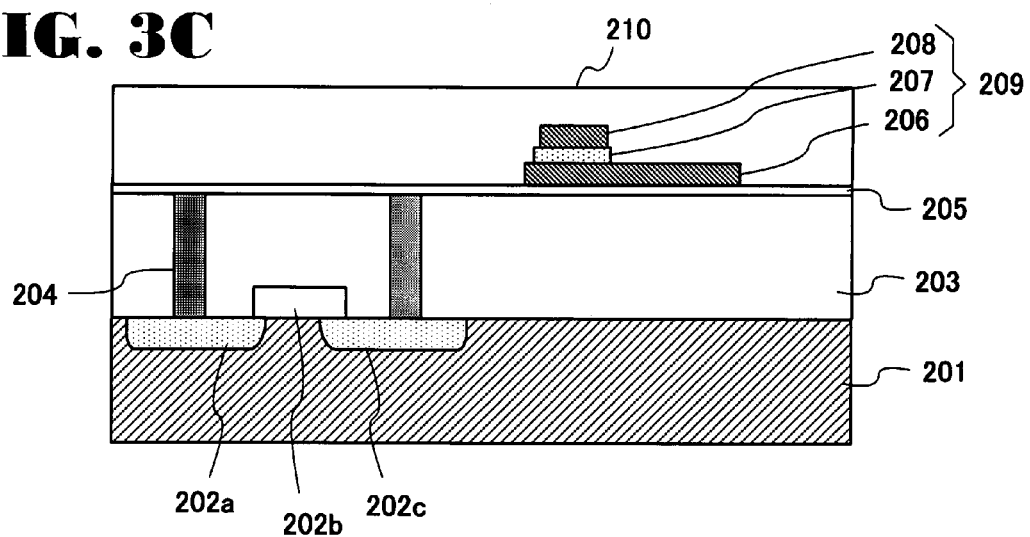

Thereafter, a lower electrode 206 of a capacity insulating film, the capacity insulating film 207, and an upper electrode 208 of the capacity insulating film are deposited sequentially (FIG. 3C). The lower electrode 206 and the upper electrode 208 are formed from Pt by a sputtering method, to film thicknesses of 150 nm and 200 nm respectively. The Pt films are formed by, for example, using Pt as the target and Ar as the process gas, under a sputtering atmospheric pressure of 10 mTorr, RF power of 1 kW, and a deposition temperature of 200° C. As the capacity insulating film 207, which is composed of a ferroelectric substance, a film of strontium bismuth tantalate ($SrBi_2Ta_2O_9$: SBT) is formed to a thickness of 120 nm.

Specifically, the capacity insulating film 207 is formed as follows. First, a precursor solution with SBT dissolved therein is applied by spin-coating. The film is dried for 5 minutes on a hot plate maintained at a temperature from 150 to 200° C. to remove its volatile contents, followed by heat treatment in a kiln at 800° C. for 30 minutes in an oxygen atmosphere, thereby obtaining a crystallized SBT film. Next, the upper electrode 208 made of Pt is processed by photolithography and etching. The gases used in the etching process are, for example, chlorine ($Cl_2$) and Ar. As the etching conditions, a gas flow rate of $Cl_2/Ar=10/10$ sccm, RF power of 120 to 500 W, and a chamber pressure of 5 mTorr are used.

Next, the capacity insulating film 207 made of SBT and the lower electrode 206 made of Pt are processed by photolithography and etching, thereby completing a capacitor 209. The gases used to etch the SBT are, for example, $Cl_2$, Ar, hydrogen bromide (HBr), and $O_2$. As the etching conditions, a gas flow rate of $Cl_2/Ar/HBr/O_2=5/12/3/3$ sccm, RF power of 100 to 800 W, and a chamber pressure of 2 mTorr are used. The etching gas and etching conditions for the Pt lower electrode 206 are the same as for the upper electrode 208.

After the etching process, with an object of restoring the ferroelectric properties, heat treatment is performed at 600 to 750° C. in an $O_2$ atmosphere for one hour.

Next, a third insulating film 210 composed of a P-TEOS—$SiO_2$ film is deposited using a CVD method, yielding the structure shown in FIG. 3C.

Figure 3D:
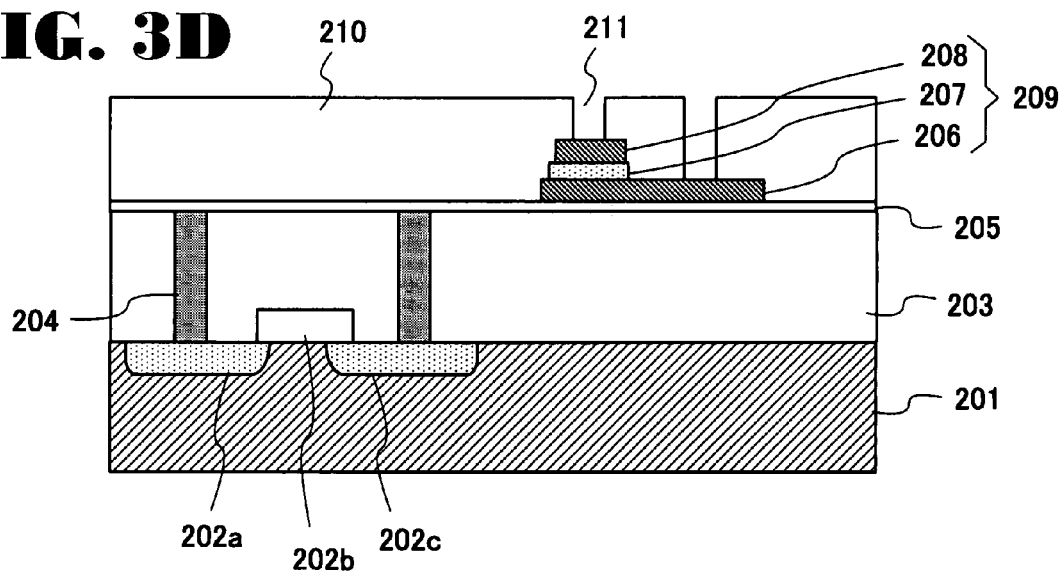

Next, as shown in FIG. 3D, contact holes 211 are formed over the upper electrode 208 and the lower electrode 206 of the capacitor 209. After the contact holes 211 are formed, with an object of restoring the ferroelectric properties, heat treatment is performed at 600 to 750° C. in an $O_2$ atmosphere for one hour.

Figure 3E:
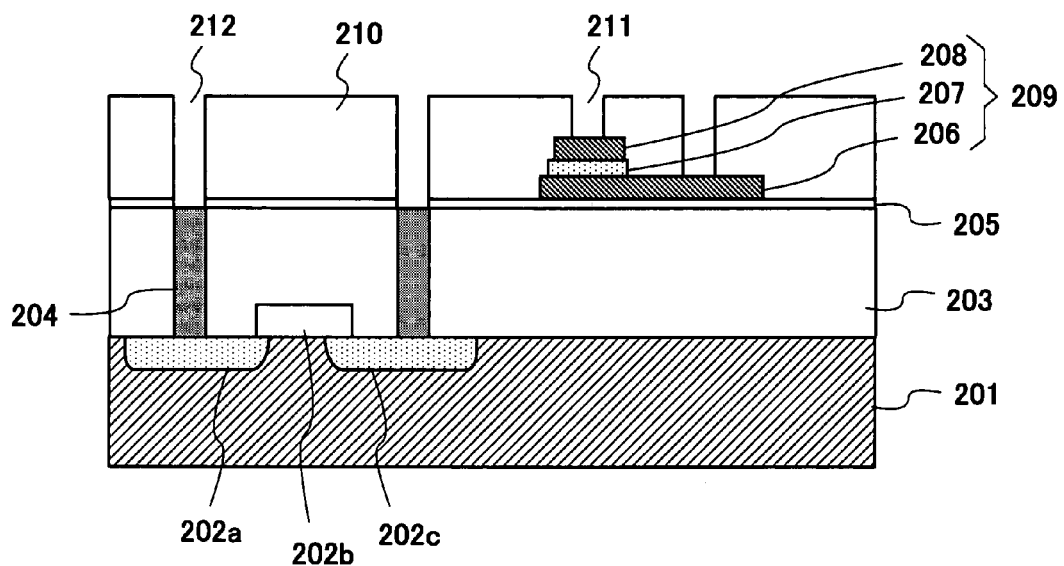

Next, as shown in FIG. 3E, contact holes 212 are formed over the metal plugs 204. The gases used in the etching process are, for example, $CHF_3$, $CF_4$, and Ar. As the etching conditions, a gas flow rate of $CHF_3/CF_4/Ar=80/15/400$ sccm, RF power of 800 W, and a chamber pressure of 500 mTorr are used.

Figure 3F:
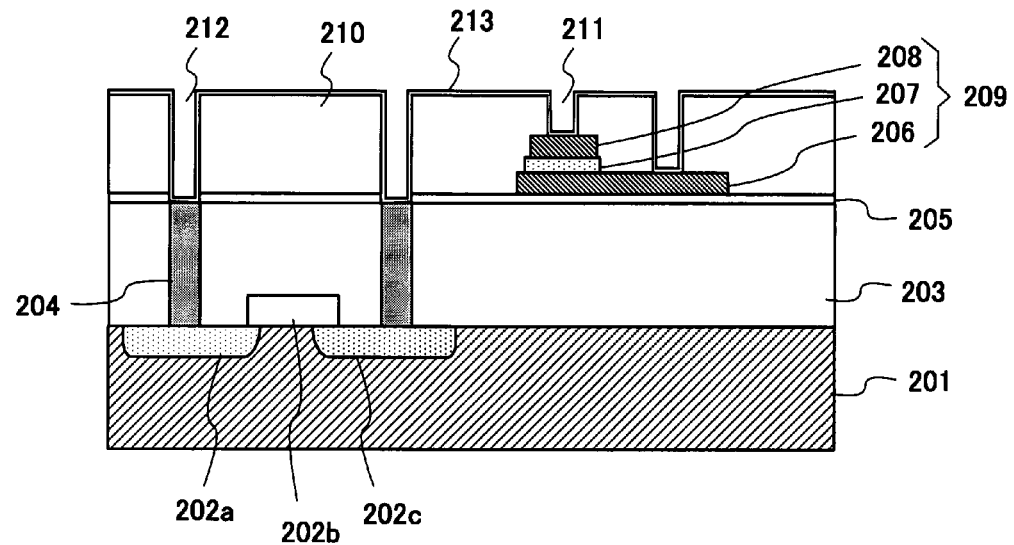

Next, as shown in FIG. 3F, a first barrier film 213 made of titanium nitride (TiN) is deposited to a thickness of 75 nm. For example, the TiN is deposited using a sputtering method with Ti as the target and $N_2$ gas as the process gas, under conditions of a gas flow rate of $N_2=165$ sccm, a sputtering atmospheric pressure of 14 mTorr, DC power of 5000 kW, and a film deposition temperature of 150° C.

Figure 3G:
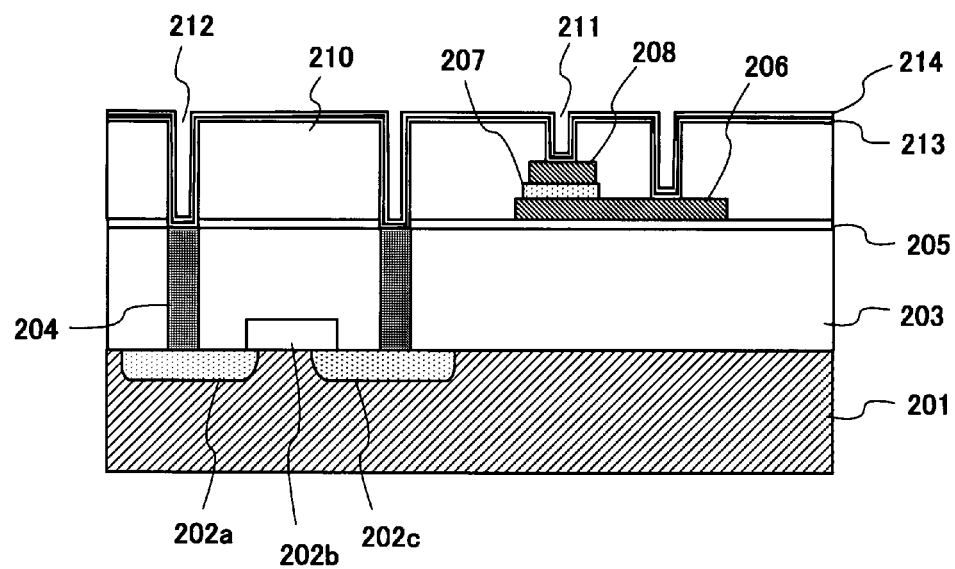

Next, the wafer is exposed to air as mentioned above to allow the first barrier film 213 to absorb oxygen, and thereafter, a second barrier film 214 made of titanium nitride (TiN) is formed to a thickness of 75 nm, as shown in FIG. 3G. For example, the TiN is deposited using a sputtering method with Ti as the target and $N_2$ gas as the process gas, under conditions of a gas flow rate of $N_2=80$ sccm, under a sputtering atmospheric pressure of 6 mTorr, DC power of 5000 kW, and a film deposition temperature of 150° C. Because this second barrier film 214 and the subsequent Al alloy film are formed sequentially in a vacuum without exposure to air, the second barrier film 214 is preferably a denser film with higher compressive stress than the first barrier 213 in order to suppress the diffusion of Al atoms.

Figure 3H:
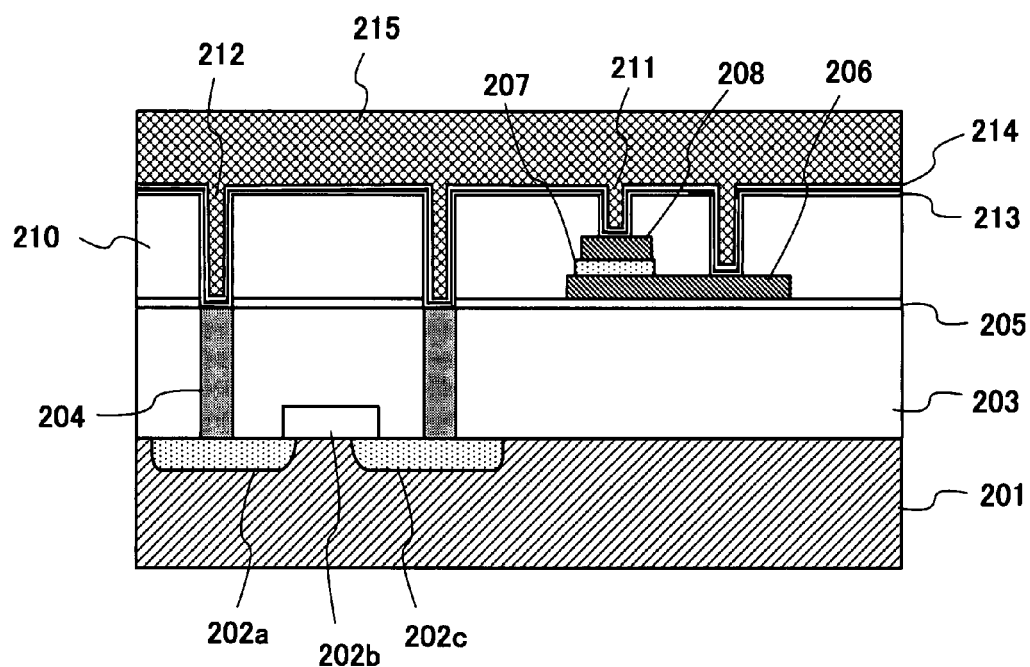
Figure 3I:
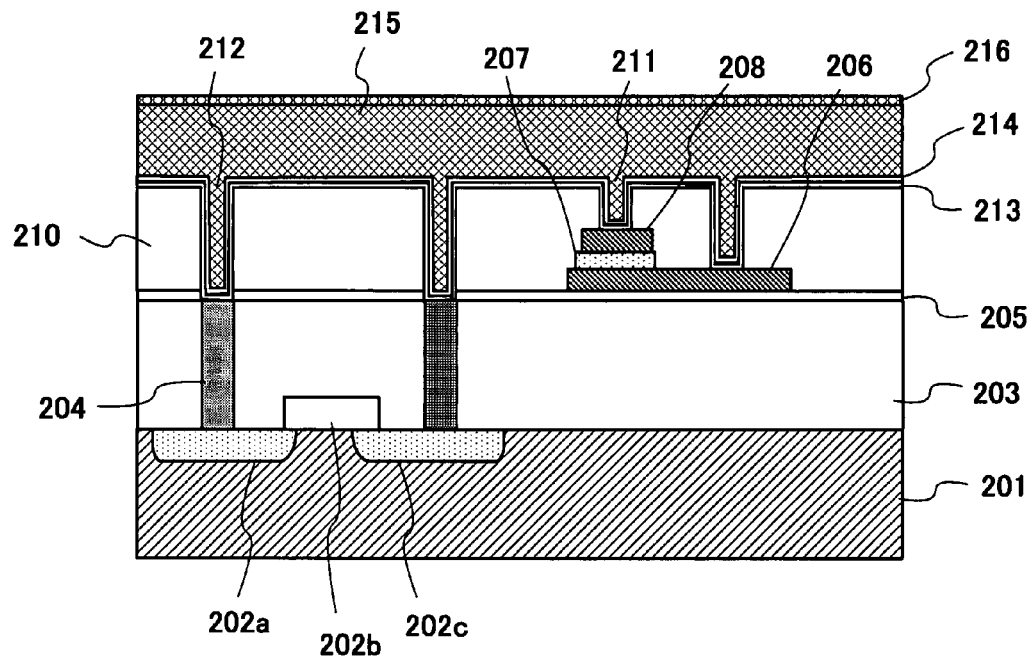

Next, as shown in FIG. 3H and FIG. 3I, a main conductive layer 215 is formed from an Al alloy, and a conductive layer 216 made of TiN which serves as an anti-reflection coating is formed thereon. Deposition of the Al alloy is performed in two steps using, for example, Al alloy as the target and Ar gas as the process gas. As the conditions in the first step, a sputtering atmospheric pressure of 3 mTorr, DC power of 9 kW, and a film deposition temperature of 400° C. are used. As the conditions in the second step, a sputtering atmospheric pressure of 3 mTorr, DC power of 2 kW, and a film deposition temperature of 400° C. are used. The conditions used for TiN deposition are the same as for the conductive barrier 213. Furthermore, here an example is used in which the main conductive layer 215 is made of an Al alloy, but Al, Cu, or an alloy containing Cu as its main component may be used instead.

Figure 3J:
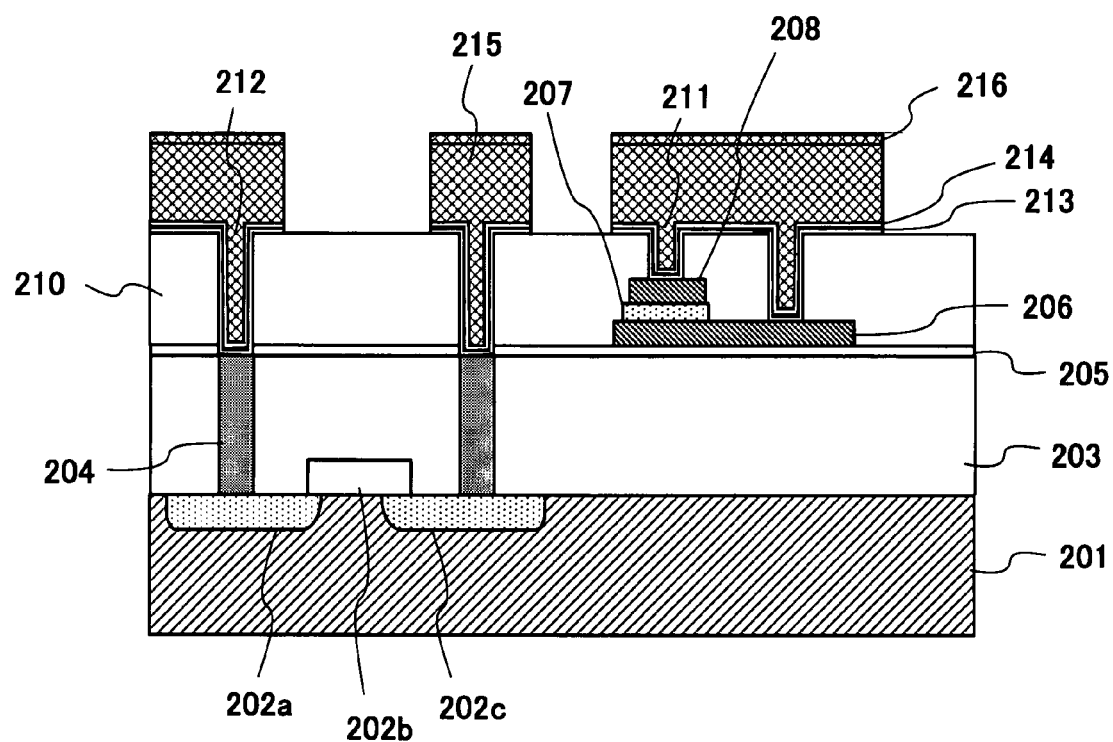

Finally, the first barrier film 213, the second barrier film 214, the main conductive layer 215, and the conductive film 216 are processed by photolithography and etching, thereby forming the wiring pattern (FIG. 3J). The gases used in the etching process are, for example, boron trichloride ($BCl_3$) and $Cl_2$. As the etching conditions, a gas flow rate of $BCl_3$/$Cl_2$=40/60 sccm, a pressure of 1 Pa, and RF power of 70 W are used.

Figure 4:
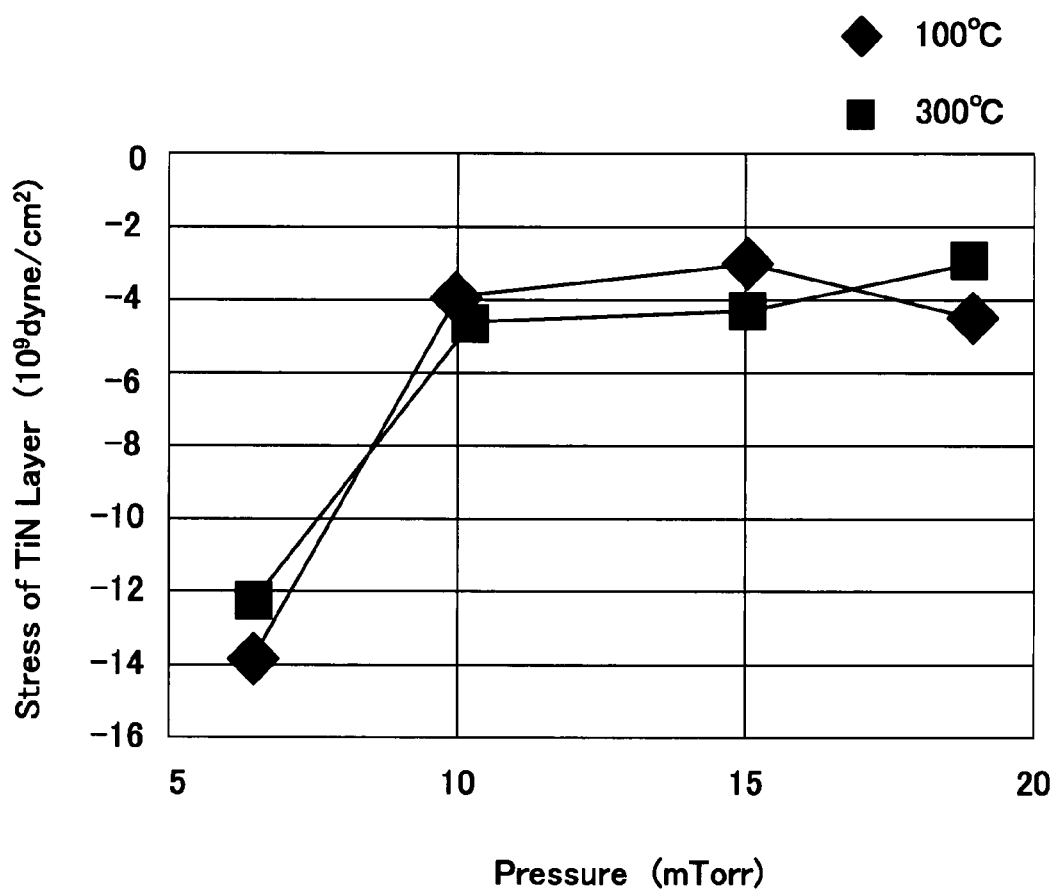
FIG. 4 is a graph used to describe the effects of and principles governing the semiconductor device according to the first embodiment of the present invention, which shows the relationship between film deposition pressure and stress in the first barrier film.

FIG. 4 is a graph used to describe the effects of and principles governing the semiconductor device according to the first embodiment of the present invention, which shows the relationship between the film deposition pressure and stress in the first barrier film. The characteristics of the first barrier film 213 according to the present invention are described below with reference to the deposition pressure dependency of the stress of the TiN layer. The TiN layer is deposited to a thickness of 75 nm, and negative numbers in the graph indicate compressive stress. At a deposition pressure of approximately 6 mTorr, compressive stress of approximately $1.2 \times 10^{10}$ dyne/$cm^2$ was exhibited, as opposed to compressive stress of approximately $4 \times 10^9$ dyne/$cm^2$ at deposition pressures exceeding 10 mTorr, a result which is lower by approximately one order of magnitude. This alleviation in compressive stress is effective in increasing the oxygen uptake of the TiN film (at the grain boundary) which is exposed to air.

Figure 5:
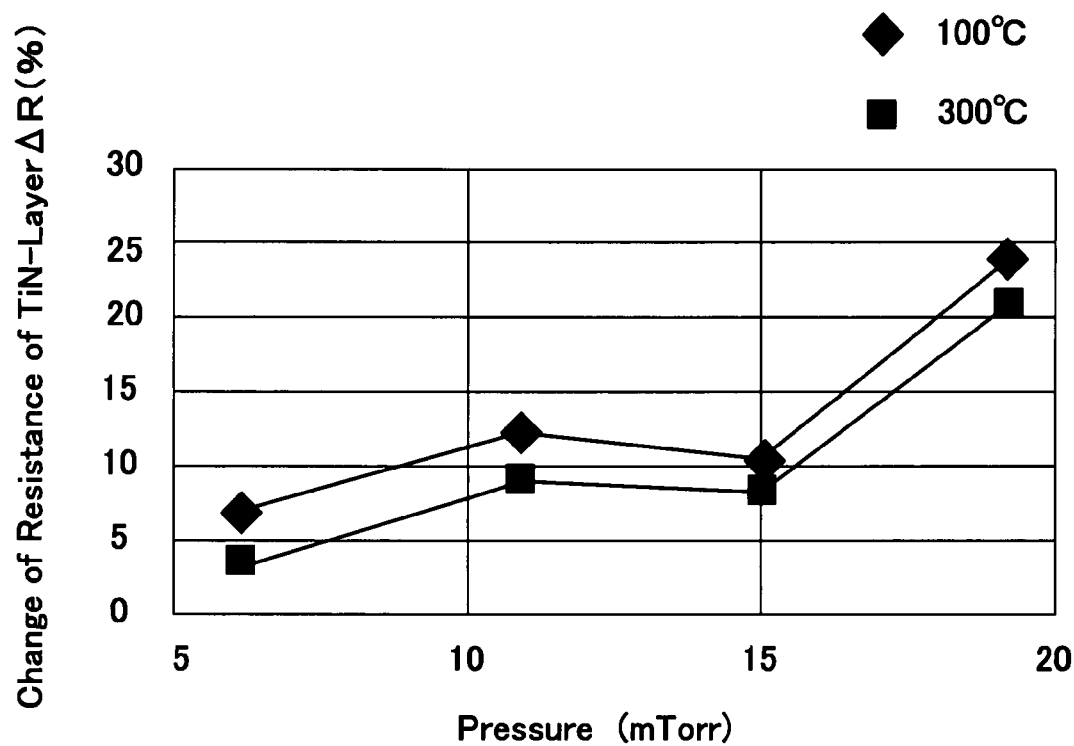
FIG. 5 is a graph used to describe the effects of and principles governing the semiconductor device according to the first embodiment of the present invention, which shows the relationship between film deposition pressure and resistance variation in the first barrier film.

FIG. 5 is a graph used to describe the effects of and principles governing the semiconductor device according to the first embodiment of the present invention, which shows the relationship between the film deposition pressure and resistance variation in the first barrier film. The graph of FIG. 5 plots the variation (increase) in sheet resistance observed in the TiN layer 10 days after deposition, relative to the sheet resistance immediately after deposition. Films deposited at a deposition pressure of approximately 6 mTorr show an increase in resistance of approximately 5%, but films deposited at a deposition pressure exceeding 10 mTorr show an increase in resistance of around 10%, or approximately twice the increase. In other words, it is apparent from FIG. 4 and FIG. 5 that increasing the deposition pressure reduces compressive stress, and results in the formation of a film whose sheet resistance increases more readily over time.

Figure 6:
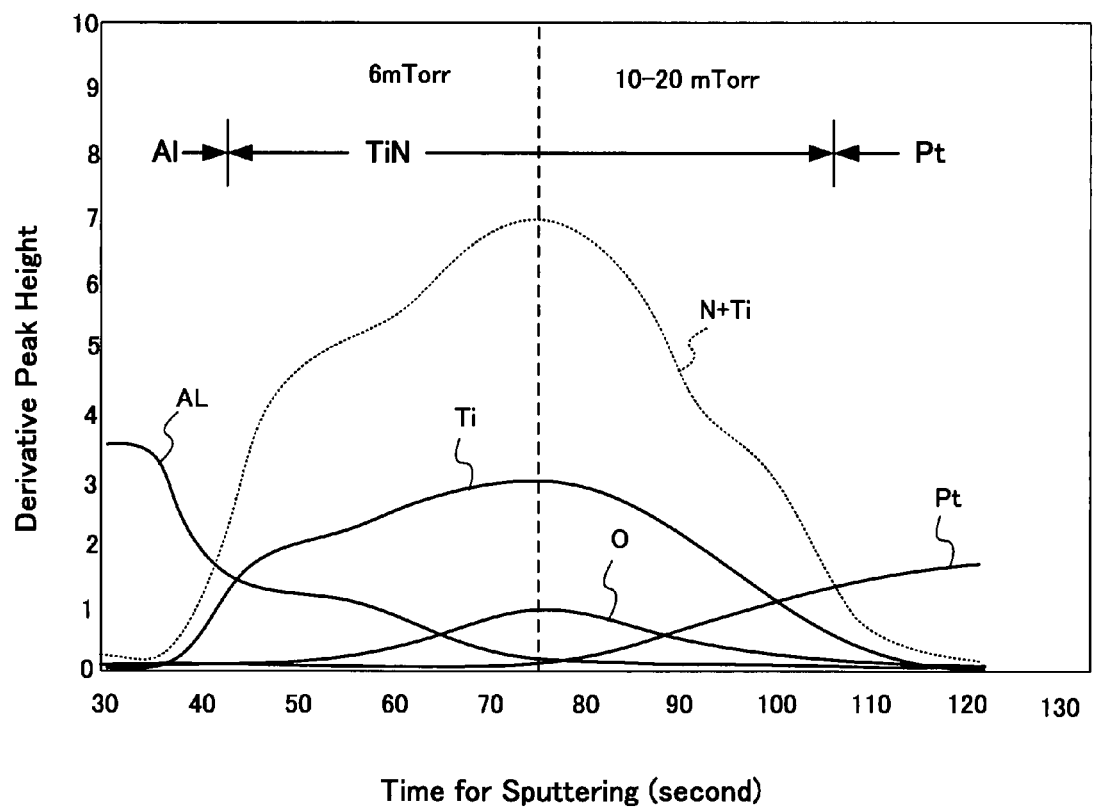
FIG. 6 is a graph used to describe the effects of the semiconductor device according to the first embodiment of the present invention, which shows a depth profile of each element as measured by AES.
Figure 7:
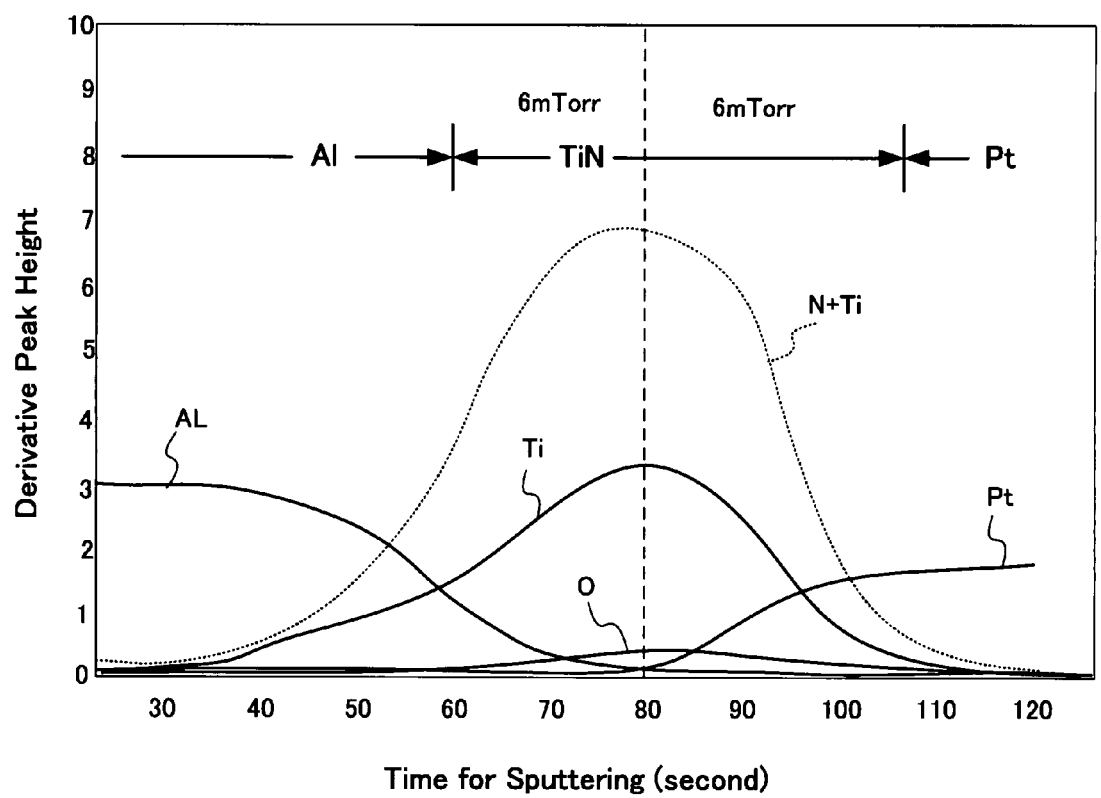
FIG. 7 is a graph used to describe the effects of a conventional semiconductor device, which shows a depth profile of each element as measured by AES.

FIG. 6 and FIG. 7 show the results of measuring the oxygen within the TiN film, to show how the increase in sheet resistance is caused by the amount of oxygen taken up by the TiN layer. FIG. 6 and FIG. 7 are depth profiles of each element measured by Auger electron spectroscopy (hereafter referred to as AES). The TiN that forms the barrier films is deposited in two steps, the first TiN (213) of which involves exposure to air (for less than 5 minutes). The first TiN layer was formed at 10 mTorr (FIG. 6), and also at 6 mTorr (FIG. 7). The dotted line near the center indicates the boundary between the first barrier film 213 and the second barrier film 214, which are formed in two steps. A comparison of the oxygen (O) peak height shows that forming the first barrier film (TiN) at pressure of 10 mTorr (FIG. 6) results in approximately twice the amount of oxygen. In other words, a film with high oxygen uptake is a film whose sheet resistance can easily be increased. The first barrier film 213 preferably contains oxygen at the grain boundaries and is capable of taking up large amounts of oxygen.

As shown above, by using a laminated barrier consisting of a first barrier film 213 with high oxygen uptake (by way of reduced compressive stress) serving as the lower layer, and a second barrier film 214 with greater compressive stress than the lower layer serving as the upper layer, encroachment of the Al into the Pt during heat treatment can be suppressed. In particular, increasing the oxygen uptake of the first barrier film 213 has a significant effect in terms of suppressing Al diffusion.

Figure 8:
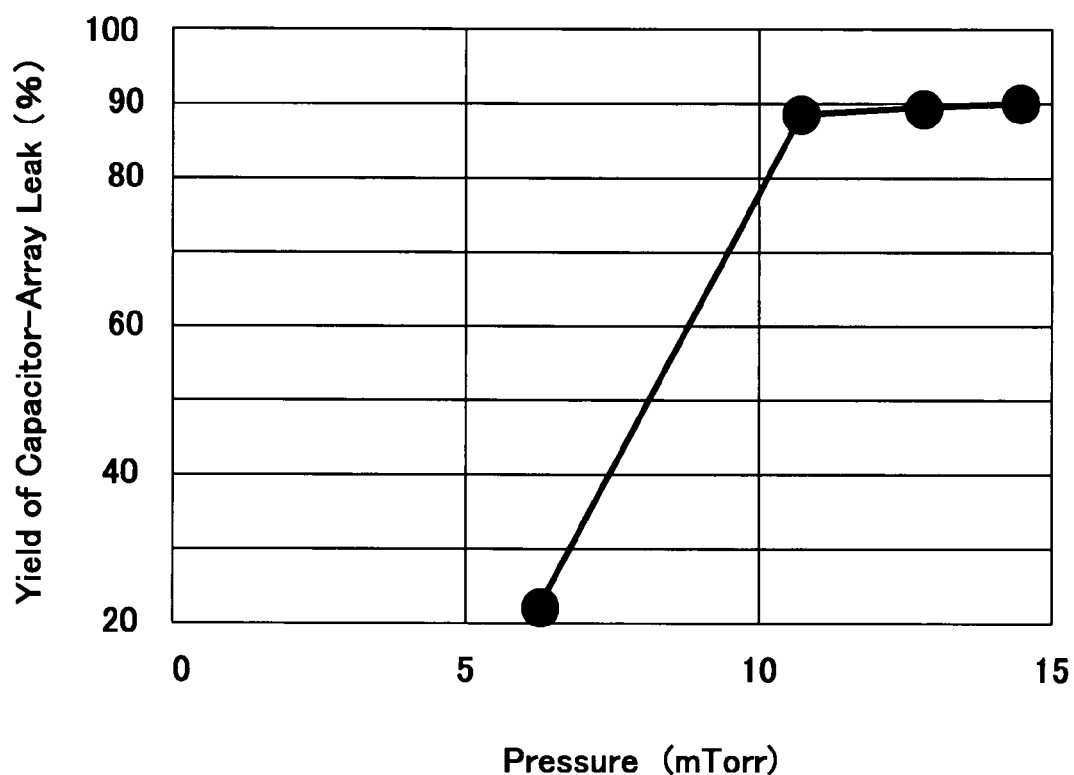
FIG. 8 is a graph showing the effects of the semiconductor device according to the first embodiment of the present invention, which shows the relationship between deposition pressure and capacitance array leakage yield.

The effects of the present invention are proven by the following data. FIG. 8 shows the first barrier deposition pressure dependency of the leakage yield. The leakage in a 64 k capacitor array was measured, and capacitors with a leakage current of 1e-6A or greater were considered defective. The presence of an Al—Pt reaction can damage the pattern, causing the leakage current to increase. It is apparent from FIG. 8 that by depositing the first TiN barrier (213) at a pressure of 10 mTorr, a high yield can be obtained even after each of the heat treatment steps is performed.

Figure 9A:
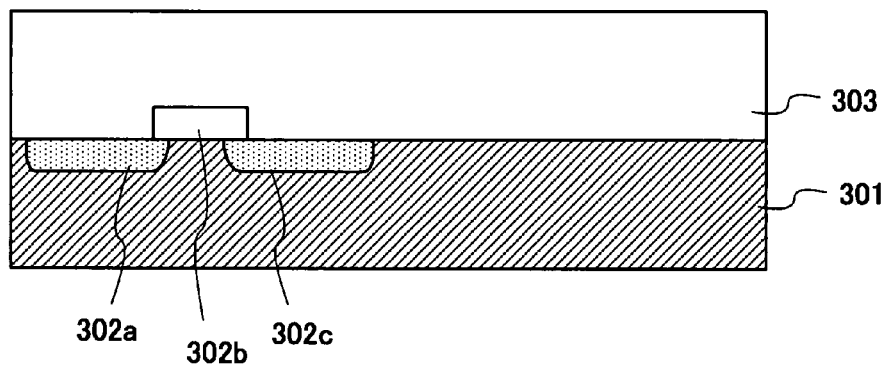
FIG. 9A to FIG. 9K are cross-sectional views showing the manufacturing steps for a semiconductor device according to a second embodiment of the present invention.

FIG. 9A through FIG. 9K are cross-sectional views showing a manufacturing process for a semiconductor device according to a second embodiment of the present invention. In comparison with the first embodiment described above, the steps preceding the formation of the first barrier film (213, 313) are substantially the same. First, an insulating layer made of $O_3$-TEOS BPSG is deposited using a CVD method to a film thickness of 1200 nm on a semiconductor substrate 301 on which transistors (302a, 302b, 302c) are already formed by a known method. Then, to planarize the surface, heat treatment is performed at 850° for 20 minutes under a $N_2$ atmosphere, and a BPSG film is flowed. In addition, an insulating layer made of spin-on glass (SOG) is applied to a thickness of 470 nm by spin coating and then etched back, thereby forming a first insulating layer 303 with a film thickness of 850 nm (FIG. 9A). The gases used in the etching process are, for example, $C_4F_8$, Ar, $O_2$, and carbon monoxide (CO). As the etching conditions, a gas flow rate of $C_4F_8$/Ar/$O_2$/CO=14/100/150/5 sccm, RF power of 1500 W, and a chamber pressure of 50 mTorr are used.

Next, photolithography and etching are performed to form a plurality of holes in the areas where the contact holes are to be located. The gases used in the etching of the holes are, for example, trifluoromethane ($CHF_3$), carbon tetrafluoride ($CF_4$), and Ar or the like. As the etching conditions, a gas flow rate of $CHF_3$/$CF_4$/Ar=40/15/400 sccm, RF power of 800 W, and a chamber pressure of 500 mTorr are used. Next, contact implantation of P+ or BF2+ or the like is performed, followed by heat treatment at 1000° C. for 10 seconds.

After heat treatment, metal films of Ti and TiN are deposited by a CVD method to film thicknesses of 15 nm and 20 nm, respectively. To deposit the Ti film, titanium tetrachloride ($TiCl_4$), argon (Ar), and $H_2$, for example, are used. The conditions used for film deposition are, for example, a gas flow rate of $TiCl_4$/Ar/$H_2$=5/350/1500 sccm, a chamber pressure of 5 Torr, RF power of 350 W, and a stage temperature of 630° C. After Ti deposition, nitriding treatment is carried out in the same chamber. The conditions for this treatment are, for example, a gas flow rate of $NH_3$/$N_2$/Ar=500/250/350 sccm, a chamber pressure of 5 Torr, RF power of 500 W, and a stage temperature of 630° C. On the other hand, to deposit the TiN film, for example, TiCl$_4$, ammonia (NH$_3$), and Ar are used. The deposition conditions are, for example, a gas flow rate of TiCl$_4$/NH$_3$/N$_2$=35/400/350 sccm, a chamber pressure of 300 mTorr, and a stage temperature of 680° C.

After TiN deposition, heat treatment is carried out in the same chamber with an object of removing chlorine from the TiN film and reducing its resistance. The heat treatment conditions are, for example, a gas flow rate of NH$_3$/N$_2$=4000/400 sccm, a chamber pressure of 8 Torr, and a stage temperature of 680° C.

Figure 9B:
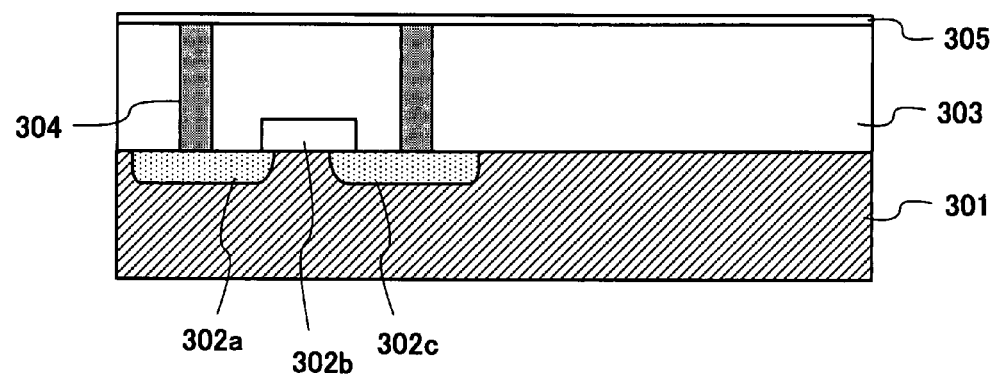

Next, a W film is deposited to a film thickness of 600 nm using a CVD method. In the formation of the W film, tungsten hexafluoride (WF$_6$), monosilane (SiH$_4$), and H$_2$, for example, are used. The deposition process is divided into two steps, each with different deposition conditions. For example, in the first step which achieves tungsten nucleation, the conditions are a gas flow rate of WF$_6$/SiH$_4$=300/100 sccm, a chamber pressure of 300 mTorr, and a stage temperature of 400°0 C. In the second step, the conditions are a gas flow rate of WF$_6$/H$_2$=500/6500 sccm, a chamber pressure of 30 Torr, and a stage temperature of 400° C. The Ti, TiN and W films are then etched back to form metal plugs 304 (FIG. 9B). The gases used in the etching process are, for example, sulfur hexafluoride (SF$_6$) and O$_2$. As the etching conditions, a gas flow rate of SF$_6$/O$_2$=250/50 sccm, RF power of 300 W, and a chamber pressure of 150 mTorr are used.

Next, a second insulating layer 305 is deposited using a sputtering method, to serve as an adhesion layer for a lower electrode of a capacity insulating film (FIG. 9B). For example, the adhesion layer 305 can be made of tantalum oxide (TaxOy). Deposition is performed using Ta as the target and Ar/O$_2$ mixed gas as the process gas, under a sputtering atmospheric pressure of 9.5 mTorr, RF power of 1.6 kW, and a film deposition temperature of 200° C.

Figure 9C:
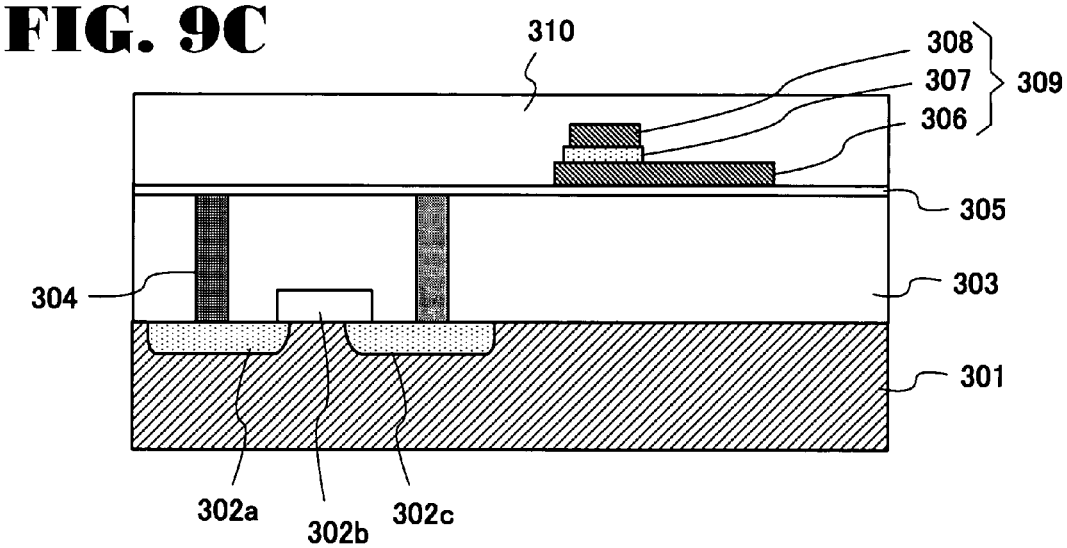

Thereafter, a lower electrode 306 of a capacity insulating film, the capacity insulating film 307, and an upper electrode 308 of the capacity insulating film are deposited sequentially (FIG. 9C). The lower electrode 306 and the upper electrode 308 are formed from Pt by a sputtering method, to film thicknesses of 150 nm and 200 nm respectively. The Pt films are formed by, for example, using Pt as the target and Ar as the process gas, under a sputtering atmospheric pressure of 10 mTorr, RF power of 1 kW, and a film deposition temperature of 200° C. As the capacity insulating film 307, which is composed of a ferroelectric substance, a film of strontium bismuth tantalate (SrBi$_2$Ta$_2$O$_9$: SBT) is formed to a thickness of 120 nm.

Specifically, the capacity insulating film 307 is formed as follows. First, a precursor solution with SBT dissolved therein is applied by spin-coating. The film is then dried for 5 minutes on a hot plate maintained at a temperature from 150 to 200° C. to remove its volatile contents, followed by heat treatment in a kiln at 800° C. for 30 minutes in an oxygen atmosphere, thereby obtaining a crystallized SBT film. Next, the upper electrode 308 made of Pt is processed by photolithography and etching. The gases used in the etching process are, for example, chlorine (Cl$_2$) and Ar. As the etching conditions, a gas flow rate of Cl$_2$/Ar=10/10 sccm, RF power of 120 to 500 W, and a chamber pressure of 5 mTorr are used.

Next, the capacity insulating film 307 made of SBT and the lower electrode 306 made of Pt are processed by photolithography and etching, thereby completing a capacitor 309. The gases used to etch the SBT are, for example, Cl$_2$, Ar, hydrogen bromide (HBr), and O$_2$. As the etching conditions, a gas flow rate of Cl$_2$/Ar/HBr/O$_2$=5/12/3/3 sccm, RF power of 100 to 800 W, and a chamber pressure of 2 mTorr are used. The etching gas and etching conditions for the Pt lower electrode 306 are the same as for the upper electrode 308.

After the etching process, with an object of restoring the ferroelectric properties, heat treatment is performed at 600 to 750° C. in an O$_2$ atmosphere for one hour.

Next, a third insulating film 310 consisting of a P-TEOS—SiO$_2$ film is deposited using a CVD method, yielding the structure shown in FIG. 9C.

Figure 9D:
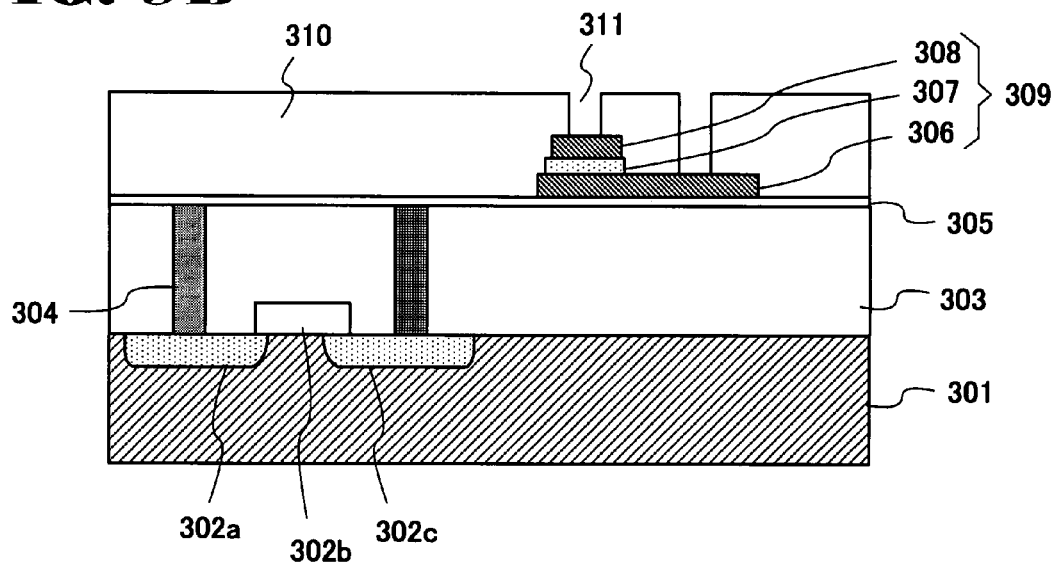

Next, as shown in FIG. 9D, contact holes 311 are formed over the upper electrode 308 and lower electrode 306 of the capacitor 309. After the contact holes 311 are formed, with an object of restoring the ferroelectric properties, heat treatment is performed at 600 to 750° C. in an O$_2$ atmosphere for one hour.

Figure 9E:
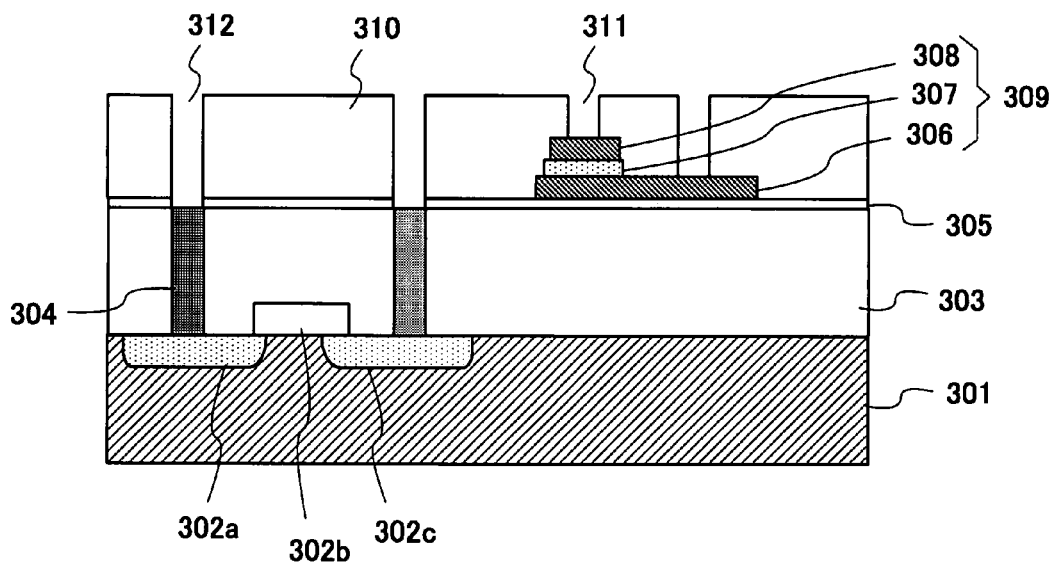

Next, as shown in FIG. 9E, contact holes 312 are formed over the metal plugs 304. The gases used in the etching process are, for example, CHF$_3$, CF$_4$, and Ar. As the etching conditions, a gas flow rate of CHF$_3$/CF$_4$/Ar=80/15/400 sccm, RF power of 800 W, and a chamber pressure of 500 mTorr are used.

Figure 9F:
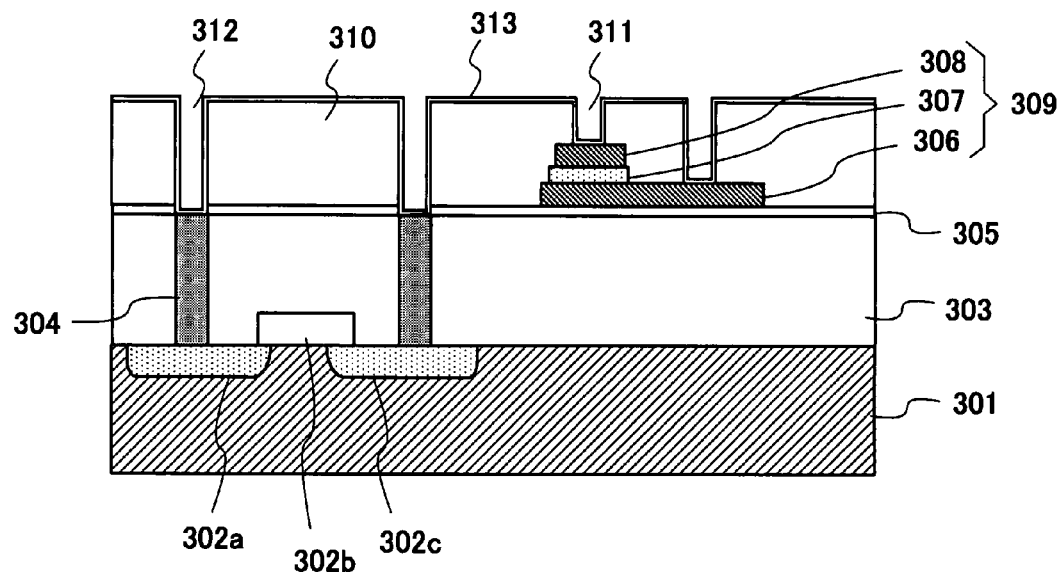

Next, as shown in FIG. 9F, a first barrier film 313 made of titanium nitride (TiN) is deposited to a thickness of 50 nm. For example, the TiN is deposited using a sputtering method with Ti as the target and N$_2$ gas as the process gas, under conditions of a gas flow rate of N$_2$=165 sccm, a sputtering atmospheric pressure of 14 mTorr, DC power of 5000 kW, and a film deposition temperature of 150° C.

Figure 9G:
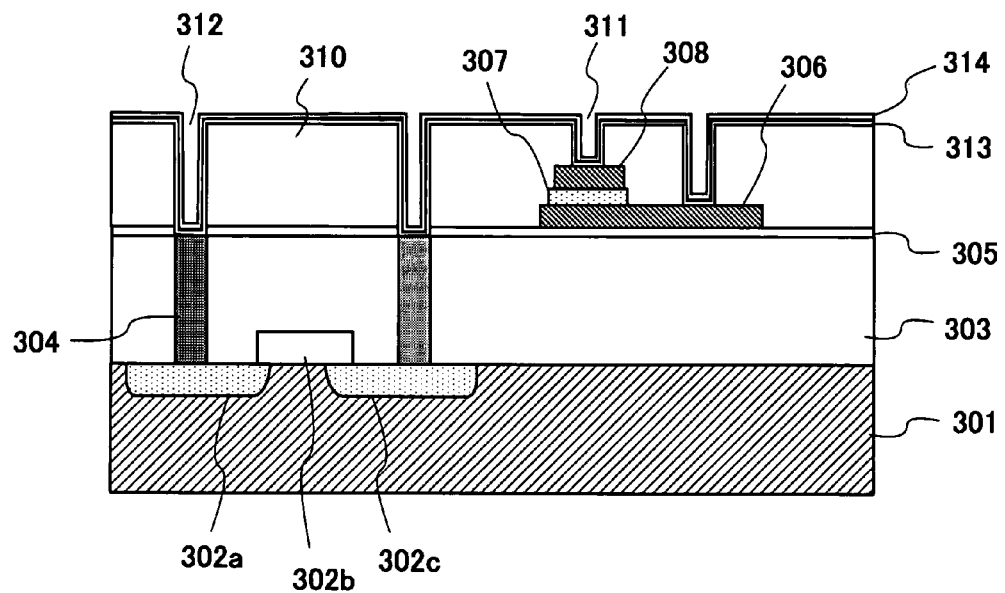

From this point onward, the process differs significantly from that of the first embodiment. As shown in FIG. 9G, a second barrier film 314 made of titanium aluminum nitride (TiAlN) is deposited to a thickness of 50 nm. For example, the TiAlN is deposited using a sputtering method with TiAl as the target and an Ar/N$_2$ mixed gas as the process gas, at a gas flow rate of Ar/N$_2$=40/100 sccm, a sputtering atmospheric pressure of 12 mTorr, DC power of 2000 kW, and a film deposition temperature of 150° C. The introduction of a dissimilar material in the form of TiAlN between the TiN barriers performs the function of reducing the continuity across the barrier grain boundary. Although the first barrier film 313 and the second barrier film 314 can each be exposed to air after formation, higher throughput can be achieved by depositing both sequentially within a vacuum.

Figure 9H:
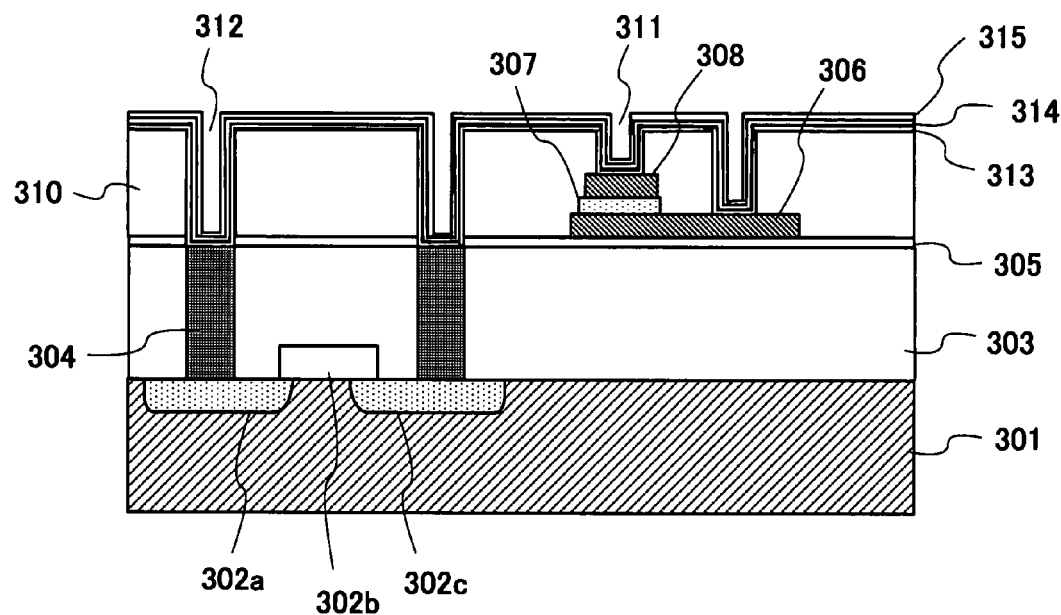

Next, as shown in FIG. 9H, a third barrier film 315 made of titanium nitride (TiN) is deposited to a thickness of 50 nm. For example, the TiN is deposited using a sputtering method with Ti as the target and N$_2$ gas as the process gas, at a gas flow rate of N$_2$=165 sccm, a sputtering atmospheric pressure of 14 mTorr, DC power of 5000 kW, and a film deposition temperature of 150° C.

Figure 9I:
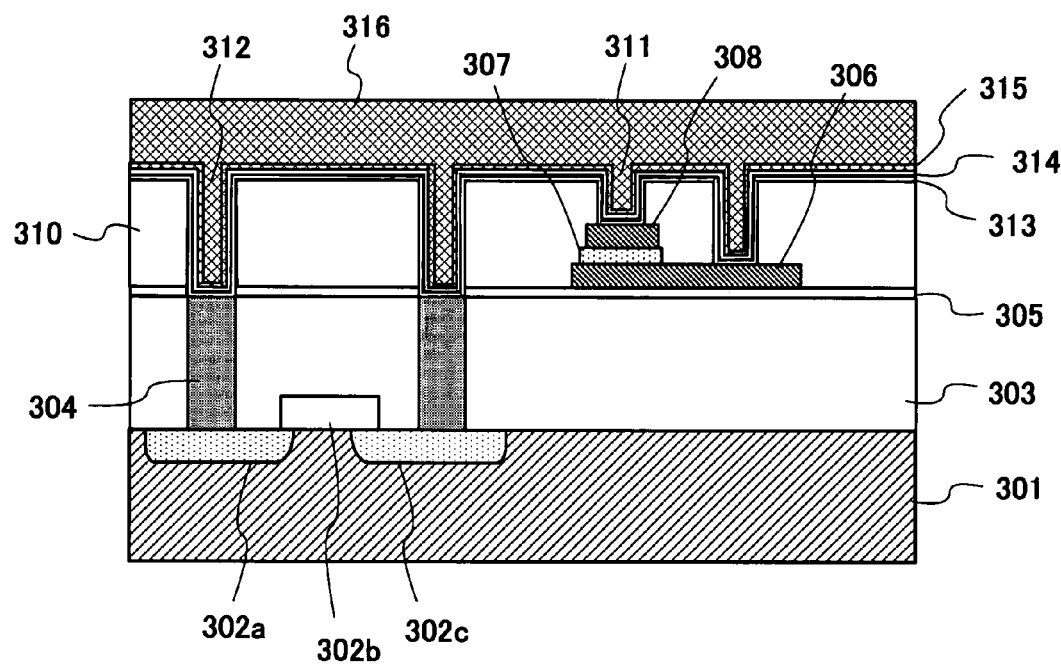
Figure 9J:
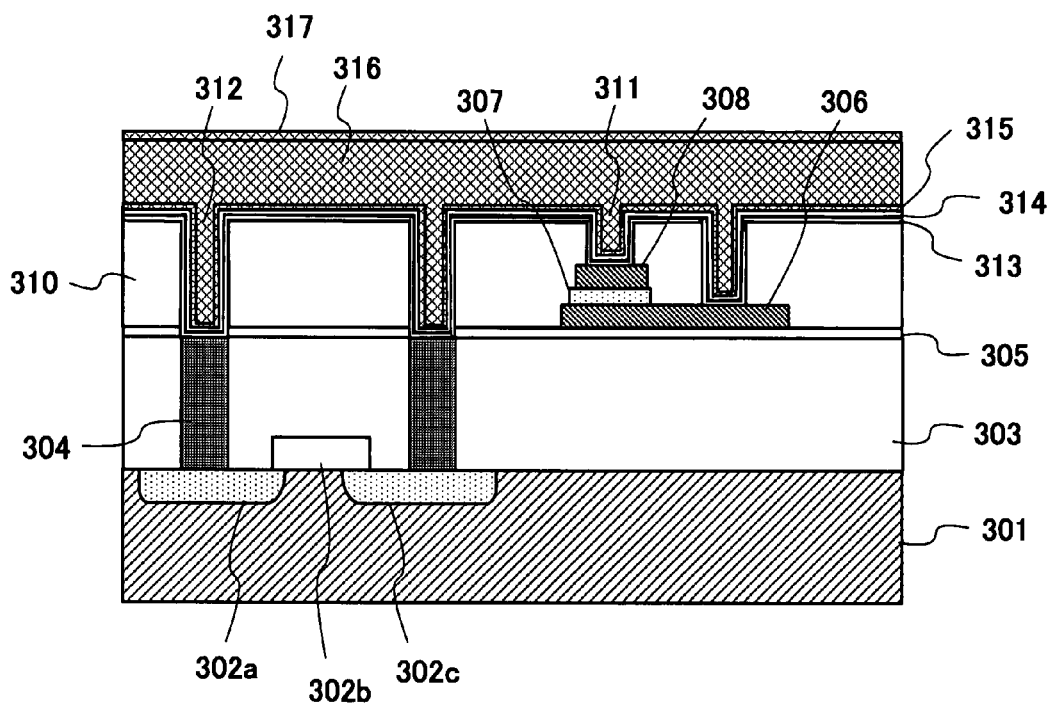

Next, as shown in FIG. 9I and FIG. 9J, a main conductive layer 316 is formed from an Al alloy, and a conductive layer 317 made of TiN which serves as an anti-reflection coating is formed thereon. Deposition of the Al alloy is performed in two steps using, for example, Al alloy as the target and Ar gas as the process gas. As the conditions in the first step, a sputtering atmospheric pressure of 3 mTorr, DC power of 9 kW, and a film deposition temperature of 400° C. are used. As the conditions in the second step, a sputtering atmospheric pressure of 3 mTorr, DC power of 2 kW, and a film deposition temperature of 400° C. are used. The conditions used for TiN deposition are the same as for the conductive barrier 313. Furthermore, here an example is used in which the main conductive layer is made of an Al alloy, but Al, Cu, or an alloy containing Cu as its main component may be used instead.

Figure 9K:
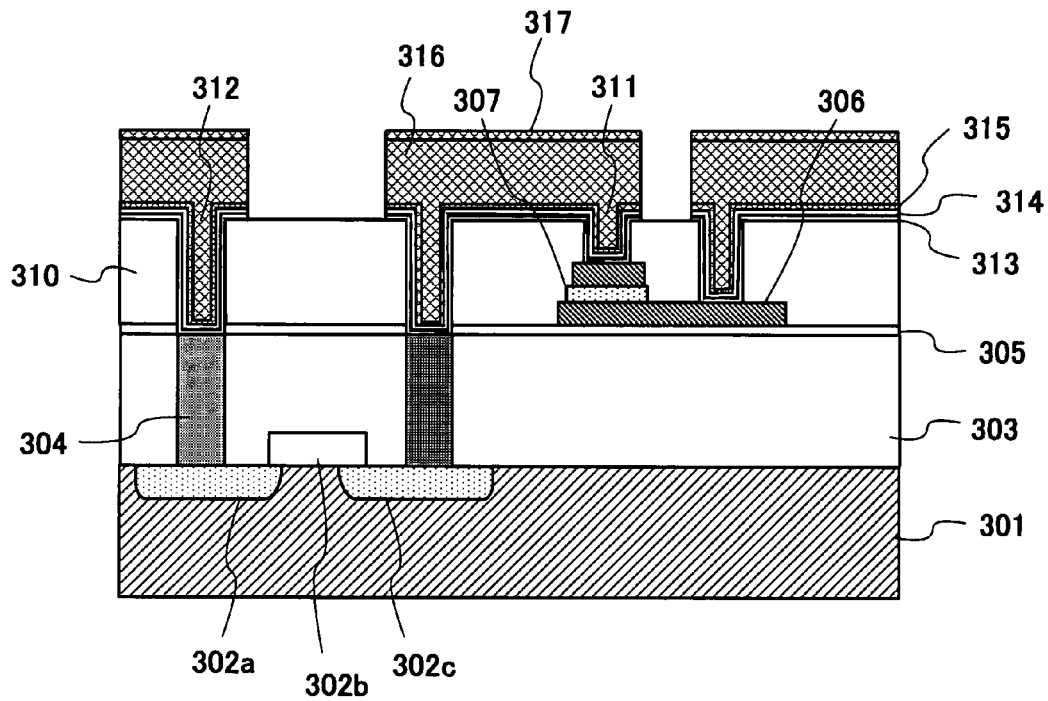

Finally, as shown in FIG. 9K, the first barrier film 313, the second barrier film 314, the third barrier film 315, the main conductive layer 316, and the conductive film 317 are processed by photolithography and etching, thereby forming the wiring pattern. The gases used in the etching process are, for example, boron trichloride ($BCl_3$) and $Cl_2$. As the etching conditions, a gas flow rate of $BCl_3/Cl_2$=40/60 sccm, a pressure of 1 Pa, and RF power of 70 W are used.

As described above, the introduction of a dissimilar material (314) between the barrier films (313, 315) reduces the continuity across the barrier grain boundary which serves as the diffusion path of the Al atoms, and this has a marked effect in terms of suppressing Al diffusion. Furthermore, high throughput can be achieved by depositing the barriers sequentially within a vacuum, eliminating venting and vacuum drawing of the wafer.

What is claimed is:

1. A semiconductor device, comprising:
   a semiconductor substrate;
   a capacitor having a lower electrode formed on said semiconductor substrate, a capacity insulating film formed on said lower electrode, and an upper electrode formed on said capacity insulating film;
   contact holes formed on said upper electrode and said lower electrode;
   a barrier layer containing oxygen, formed inside said contact holes, said barrier layer being a laminated structure of a plurality of layers, including a first barrier layer located on an electrode side, a third barrier layer formed on the first barrier layer, and a second barrier layer sandwiched between said first and third barrier layers, said first and third barrier layers being made of the same material, and said second barrier layer being made of a material different from said first and third barrier layer, said first and third barrier layers being made of TiN, and said second barrier layer being made of TiAlN; and
   a conductive layer which fills said contact holes in which said barrier layer is formed on the inside.

2. A semiconductor device according to claim 1, wherein said conductive layer is made of Al or an Al alloy.

3. A semiconductor device according to claim 1, wherein said upper electrode and lower electrode are made of Pt.

4. A semiconductor device according to claim 1, wherein said second barrier layer is in direct contact with said first barrier layer and said third barrier layer.

* * * * *